US012791911B2

(12) United States Patent
Kim et al.

(10) Patent No.: US 12,791,911 B2

(45) Date of Patent: Nov. 10, 2026

(54) ANALOG FRONT-END CIRCUIT AND CAMERA MODULE CONTROL DRIVER INCLUDING THE SAME

(71) Applicant: LX SEMICON CO., LTD., Daejeon (KR)

(72) Inventors: Hyung Seup Kim, Daejeon (KR); Kyu Ho Kim, Daejeon (KR); Dong Hwan Yoon, Daejeon (KR); Jin Kook Yun, Daejeon (KR); Dong Gil Jeong, Daejeon (KR)

(73) Assignee: LX SEMICON CO., LTD., Daejeon (KR)

( * ) Notice: Subject to any disclaimer, the term of this patent is extended or adjusted under 35 U.S.C. 154(b) by 188 days.

(21) Appl. No.: 18/532,400

(22) Filed: Dec. 7, 2023

(65) Prior Publication Data

US 2024/0192575 A1 Jun. 13, 2024

(30) Foreign Application Priority Data

Dec. 7, 2022 (KR) ........................ 10-2022-0169605
Sep. 4, 2023 (KR) ........................ 10-2023-0117018

(51) Int. Cl.

*G03B 5/00* (2021.01)
*H03K 5/003* (2006.01)
*H03M 1/38* (2006.01)

(52) U.S. Cl.

CPC ............... *G03B 5/00* (2013.01); *H03K 5/003* (2013.01); *H03M 1/38* (2013.01); *G03B 2205/0007* (2013.01)

(58) Field of Classification Search

CPC ... G03B 5/00; G03B 5/02; G03B 5/04; G03B 2205/0007; G03B 2205/0015;

(Continued)

(56) References Cited

U.S. PATENT DOCUMENTS

2007/0247141 A1 10/2007 Pastre et al.
2013/0093416 A1 4/2013 Haas et al.

(Continued)

FOREIGN PATENT DOCUMENTS

JP 2016-161276 A 9/2016
WO 2022209720 A1 10/2022

OTHER PUBLICATIONS

Extended European Search Report dated Apr. 25, 2024, issued for the corresponding European Patent Application No. 23214791.8, 10 pages.

*Primary Examiner* — Jie Lei

(74) *Attorney, Agent, or Firm* — ROTHWELL, FIGG, ERNST & MANBECK, P.C.

(57) ABSTRACT

An analog front-end circuit includes a hall bias correction loop circuit configured to correct a sensing voltage of a hall sensor by adjusting a hall bias current flowing in the hall sensor while tracking a change in the sensing voltage of the hall sensor based on a temperature change, an offset correction loop circuit configured to correct an offset correction voltage while tracking an offset change of the hall sensor and an offset change of an amplifier circuit based on the temperature change, the amplifier circuit configured to amplify and output the sensing voltage of the hall sensor, corrected through at least one of the hall bias correction loop circuit and the offset correction loop circuit, and an analog-digital converter configured to convert an output voltage of the amplifier circuit into sensing data and output the sensing data.

10 Claims, 5 Drawing Sheets

(58) Field of Classification Search
CPC ............ G03B 2205/0069; G02B 27/64; G02B 27/646; G02B 15/14; G02B 7/06; G02B 23/02; G02B 23/18; G01R 33/00; G01R 33/07; G01R 33/0035; G01R 33/072; G01R 33/0082; H03K 5/003; H03M 1/38
USPC ....... 359/554, 557, 410, 419, 813, 814, 819, 359/820, 823, 824, 683; 396/52, 55, 53, 396/89, 97
See application file for complete search history.

(56) References Cited

U.S. PATENT DOCUMENTS

| | | | |
|---|---|---|---|
| 2016/0073027 | A1 | 3/2016 | Noguchi et al. |
| 2016/0139230 | A1 | 5/2016 | Petrie et al. |
| 2021/0293901 | A1 | 9/2021 | Dupre et al. |
| 2024/0003992 | A1 | 1/2024 | Yajima et al. |

ANALOG FRONT-END CIRCUIT AND CAMERA MODULE CONTROL DRIVER INCLUDING THE SAME

CROSS-REFERENCE TO RELATED APPLICATIONS

This application claims the benefit of Korean Patent Application Nos. 10-2022-0169605, filed on Dec. 7, 2022 and 10-2023-0117018, filed on Sep. 4, 2023, which are hereby incorporated by reference in their entirety as if fully set forth herein.

TECHNICAL FIELD

The present disclosure relates to an analog front-end circuit and a control driver of a camera module including the analog front-end circuit, for automatically correcting a sensing voltage change and an offset change based on a temperature change.

BACKGROUND

Camera modules mounted on mobile electronic devices such as smartphones and tablets have a shake correction function to prevent an image from shaking due to hand shake of a user when taking pictures.

To prevent hand shake, a camera module uses optical image stabilization (OIS) technology, which senses and compensates for movement of the camera module caused by hand shake of a user. The camera module includes a gyro sensor and an OIS control driver, and thus may sense, compensates for, and offset the movement of the camera module.

The OIS control driver senses the position of an actuator through a hall sensor and uses the sensing result to correct the position of the actuator, and thus it is necessary to receive an accurate sensing signal from the hall sensor irrespective of temperature and offset changes.

SUMMARY

To overcome the above problems, an object of the present disclosure is to provide an analog front-end circuit and a control driver of a camera module including the analog front-end circuit, for automatically correcting a sensing voltage change and an offset change based on a temperature change.

According to an aspect of the present disclosure, an analog front-end circuit includes a hall bias correction loop circuit configured to correct a sensing voltage of a hall sensor by adjusting a hall bias current flowing in the hall sensor while tracking a change in the sensing voltage of the hall sensor based on a temperature change, an offset correction loop circuit configured to correct an offset correction voltage while tracking an offset change of the hall sensor and an offset change of an amplifier circuit based on the temperature change, the amplifier circuit configured to amplify and output the sensing voltage of the hall sensor, corrected through at least one of the hall bias correction loop circuit and the offset correction loop circuit, and an analog-digital converter configured to convert an output voltage of the amplifier circuit into sensing data and output the sensing data.

According to another aspect of the present disclosure, a control driver of a camera module includes a plurality of actuators configured to drive a lens module, a plurality of hall sensors respectively disposed on the plurality of actuators and configured to sense respective positions of the plurality of actuators and output each sensing signal, an analog front-end circuit configured to correct a sensing voltage change of each of the plurality of hall sensor based on a temperature change, correct an offset change based on the temperature change, amplify the sensing voltage of each of the plurality of hall sensors, in which the sensing voltage change and the offset change are corrected, and convert the amplified sensing voltage into a plurality of sensing data, a controller configured to generate a plurality of control signals using the plurality of sensing data, and a driver configured to drive the plurality of actuators configured to drive each of the plurality of actuators using the plurality of control signals, respectively.

DETAILED DESCRIPTION

Figure 1:
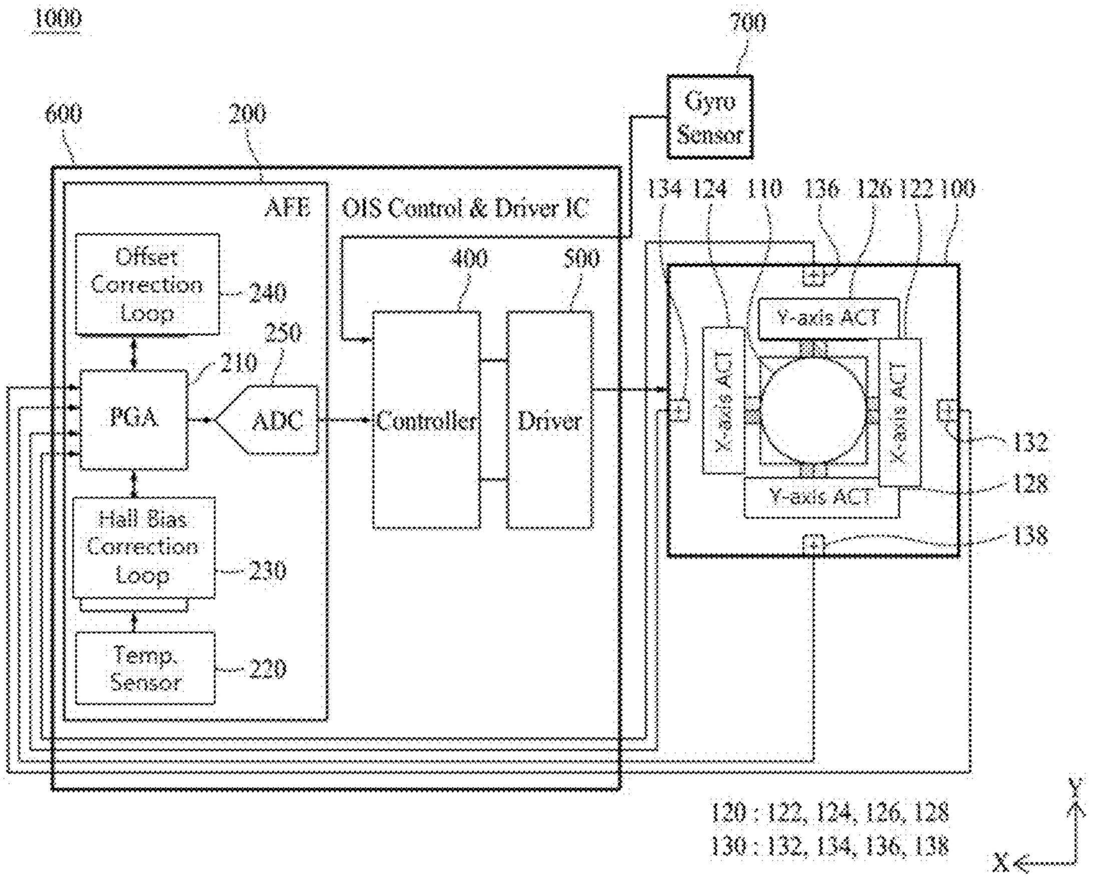
FIG. 1 is a schematic block diagram of a camera module including an optical image stabilization (OIS) control driver according to an embodiment of the present disclosure.

Throughout the specification, like reference numerals are used to refer to substantially the same components. In the following description, detailed descriptions of components and features known in the art may be omitted if they are not relevant to the core configuration of the present disclosure. The meanings of terms used in this specification are to be understood as follows.

The advantages and features of the present disclosure, and methods of achieving them, will become apparent from the detailed description of the embodiments, together with the accompanying drawings. However, the present disclosure is not limited to the embodiments disclosed herein and will be implemented in many different forms. The embodiments are provided merely to make the disclosure of the present disclosure thorough and to fully inform one of ordinary skill in the art to which the present disclosure belongs of the scope of the disclosure. It is to be noted that the scope of the present disclosure is defined only by the claims.

Like reference numerals refer to like elements throughout the specification. Further, in describing the present disclosure, descriptions of well-known technologies may be omitted in order to avoid obscuring the gist of the present disclosure.

As used herein, the terms “includes,” “has,” “comprises,” and the like should not be construed as being restricted to the means listed thereafter unless specifically stated otherwise. Where an indefinite or definite article is used when referring to a singular noun, this includes a plural of that noun unless something else is specifically stated.

In describing temporal relationships, terms such as “after,” “subsequent to,” “next to,” “before,” and the like may include cases where any two events are not consecutive, unless the term "immediately" or "directly" is explicitly used.

While the terms first, second, and the like are used to describe various elements, the elements are not limited by these terms. These terms are used merely to distinguish one element from another. Accordingly, a first element referred to herein may be a second element within the technical idea of the present disclosure.

It should be understood that the term "at least one" includes all possible combinations of one or more related items. For example, the phrase "at least one of the first, second, and third items" can mean each of the first, second, or third items, as well as any possible combination of two or more of the first, second, and third items.

Features of various embodiments of the present disclosure can be partially or fully combined. As will be clearly appreciated by those skilled in the art, various interactions and operations are technically possible. Embodiments can be practiced independently of each other or in conjunction with each other.

Hereinafter, embodiments of the present disclosure will be described with reference to the attached drawings.

FIG. 1 is a schematic block diagram of a camera module including an optical image stabilization (OIS) control driver according to an embodiment of the present disclosure.

Referring to FIG. 1, a camera module 1000 according to an embodiment may include an actuator module 100, an OIS control driver 600, and a gyro sensor 700.

The camera module 1000 may further include a lens module 110 and an image sensor module (not shown). The lens module 110 may be coupled to the actuator module 100 and moved by driving of the actuator module 100.

The lens module 100 includes a plurality of lenses to collect incident light and to emit the light to a sensor surface of the image sensor. The image sensor module may separate the light reflected from an object and collected through the lens module for each color of red, green, and blue (R/G/B), sense incident optical signals of the respective colors from respective pixels, and convert the optical signals into electrical signals to sense an image.

The actuator module 100 may include an actuator unit 120 including a plurality of X-axis and Y-axis actuators (ACT) 122, 124, 126, and 128 that are driven (moved) according to an actuator driving signal supplied from the OIS control driver 600 and configured to move the lens module 110 in X-axis and Y-axis directions.

The plurality of actuators 122, 124, 126, and 128 may separately receive a plurality of actuator driving signals from the OIS control driver 600 and driven, respectively. The X-axis and Y-axis directions may be defined as first and second directions among horizontal directions orthogonal to an optical axis (Z axis) direction of the lens module 110.

The plurality of actuators 122, 124, 126, and 128 may generate electromagnetic force between a coil and a magnet to move the lens module 110. The plurality of actuator driving signals may be current signals applied to coils of the plurality of actuators 122, 124, 126, and 128, respectively. The plurality of actuators 122, 124, 126, and 128 may be any one of various types of actuators such as a voice coil motor (VCM) type actuator, a shape memory alloy (SMA) type actuator, and a ball type actuator.

When a change in an angle of the camera module 1000 occurs due to hand shake, the actuator unit 120 may perform an OIS function by being driven under control of the OIS control driver 600 to move the lens module 110 in an opposite direction to offset the change in the angle of the camera module 1000. The OIS function may be represented by a shake correction function, a hand shake correction function, or a motion correction function.

The actuator module 100 may include a hall sensor unit 130 including a plurality of hall sensors 132, 134, 136, and 138 configured to sense the positions of the plurality of actuators 122, 124, 126, and 128, respectively. The plurality of hall sensors 132, 134, 136, and 138 may separately sense the positions of the plurality of actuators 122, 124, 126, and 128 that are each moved in the X-axis and Y-axis directions and may output the plurality of sensed positions signals to the OIS control driver 600.

For example, the plurality of hall sensors 132, 134, 136, and 138 may sense a magnetic field strength of a magnet according to movement of the plurality of actuators 122, 124, 126, and 128 to sense the positions of the plurality of actuators 122, 124, 126, and 128, respectively. The hall sensors 132, 134, 136, and 138 may each be defined as a position sensor. Each of the hall sensors 132, 134, 136, and 138 may be represented as a hall element, a hall device, or a magnetic field sensor.

The gyro sensor 700 may sense an angle change of the camera module due to hand shake, convert the sensed angle change into angular velocity information, and output the angular velocity information to the OIS control driver 600. The gyro sensor 700 may be defined as a motion sensor or an angular velocity sensor.

The OIS control driver 600 may offset the angle change of the camera module sensed through the gyro sensor 700 by moving the lens module 110 in an opposite direction through driving of the plurality of actuators 122, 124, 126, and 128, thereby correcting hand shake.

The OIS control driver 600 may be implemented as an integrated circuit (IC) by integrating a controller 400 and a driver 500 together. The OIS control driver 600 may be expressed as an OIS control IC, an OIS driver IC, or an OIS driver system.

The OIS control driver 600 may include an analog front-end (AFE) circuit 200, the controller 400, and the driver 500.

The AFE circuit 200 may amplify a fine sensing voltage input from each of the plurality of hall sensors 132, 134, 136, and 138, convert the amplified sensing voltage into digital sensing data, and output the digital sensing data to the controller 400.

The AFE circuit 200 may include a programmable gain amplifier (PGA) 210, a temperature sensor 220, a hall bias correction loop circuit 230, an offset correction loop circuit 240, and an analog-to-digital converter (ADC) 250.

In particular, the AFE circuit 200 according to an embodiment may track and correct a sensing voltage change input from the hall sensors 132, 134, 136, and 138 based on a change in resistance of each of the hall sensors 132, 134, 136, and 138 due to a temperature change, and an offset change of the hall sensors 132, 134, 136, and 138 and an offset change of the PGA 210 due to the temperature change, through a dual automatic correction loop.

The AFE circuit 200 may automatically correct the sensing voltage change and the offset changes due to a temperature change through a dual automatic correction loop using a tracking method of a successive approximation register (SAR) logic. The AFE circuit 200 may amplify a sensing voltage obtained by correcting the sensing voltage change and the offset change due to the temperature change, convert the amplified sensing voltage into sensing data, and output the sensing data to the controller 400.

The temperature sensor 220 may sense the temperature change and operate the hall bias correction loop circuit 230 and the offset correction loop circuit 240 according to a temperature change sensing signal.

The hall bias correction loop circuit 230 may correct an input range of the sensing voltage by tracking the sensing voltage change of the hall sensor unit 130, which is varied depending on a resistance change of the hall sensor unit 130 due to the temperature change sensed by the temperature sensor 220, and adjusting a hall bias current of the hall sensor unit 130 to correct the sensing voltage. The hall bias correction loop circuit 230 may track the sensing voltage change according to the resistance change using an SAR logic.

The hall bias correction loop circuit 230 may correct an input range of each of a plurality of sensing voltages output from the plurality of hall sensors 132, 134, 136, and 138, respectively.

After a sensing voltage correction operation of the hall bias correction loop circuit 230, the offset correction loop circuit 240 may correct an output voltage of the PGA 210 based on an offset of the hall sensor unit 130 and an offset of the PGA 210 by tracking an output voltage change of the PGA 210 based on an offset change from a temperature change due to the temperature change sensed by the temperature sensor 220 and adjusting an offset correction voltage. The offset correction loop circuit 240 may track the output voltage change of the PGA 210 based on the offset change using a SAR logic.

The offset correction loop circuit 240 may correct an offset of each of the plurality of hall sensors 132, 134, 136, and 138 and an offset of the PGA 210.

The hall bias correction loop circuit 230 and the offset correction loop circuit 240 may automatically perform a correction operation according to an option signal or may manually perform a correction operation under external control.

The PGA 210 may separately amplify and output a plurality of sensing signals that are output from the plurality of hall sensors 132, 134, 136, and 138 and corrected by the hall bias correction loop circuit 230 and the offset correction loop circuit 240. The PGA 210 may use at least one of various amplifiers including a single opamp difference amplifier, an instrumentation amplifier (IA), a fully differential amplifier, or a differential difference amplifier (DDA). The PGA 210 may output the plurality of amplified sensing signals to the ADC 250 through a multiplexer.

The ADC 250 may convert sensing signals of a plurality of channels, amplified by the PGA 210, into digital sensing data and output the converted digital sensing data to the controller 400.

The controller 400 may calculate a target position value using the angular velocity information supplied from the gyro sensor 700, calculate an error value between the calculated target position value and the sensing data of the plurality of channels, supplied from the ADC 250, generate control signals of the plurality of channels for correcting the calculated error value, and output the control signals to the driver 500. As the controller 400, a signal processor such as a microcontroller unit (MCU), a central processing unit (CPU), or a digital signal processor (DSP) may be used.

The driver 500 may generate actuator driving signals of a plurality of channels according to control signals of the plurality of channels, supplied from the controller 400, and may separately drive the plurality of actuators 122, 124, 126, and 128. The actuator driving signal may be generated in the form of a static-current signal or a pulse width modulation (PWM) signal. The driver 500 may drive each of the plurality of actuators 122, 124, 126, and 128 according to the actuator driving signals of the plurality of channels to move the lens module 110, thereby correcting hand shake.

Figure 2:
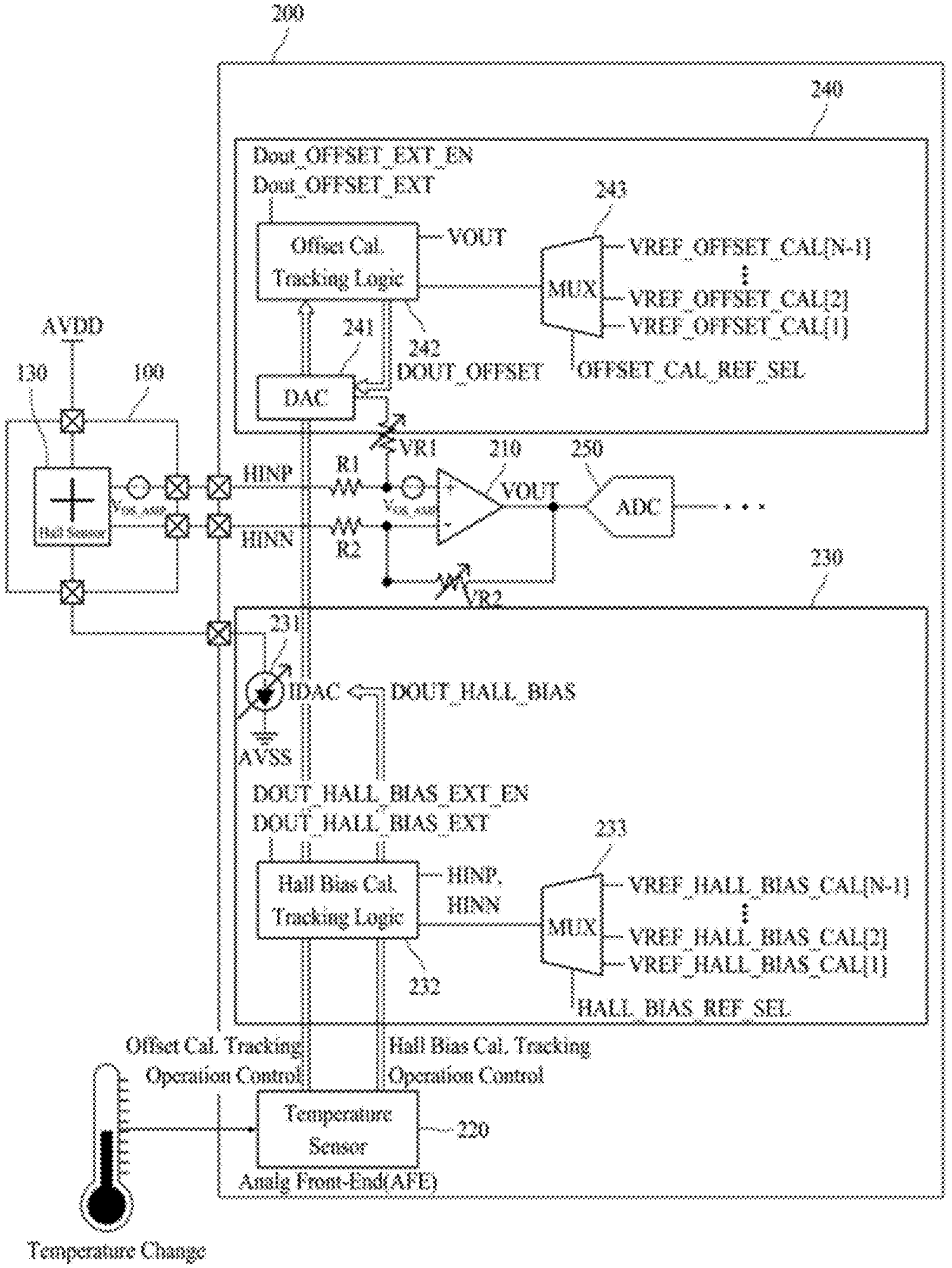
FIG. 2 is a circuit diagram showing a configuration of an analog front-end circuit in an OIS control driver, according to an embodiment of the present disclosure.
Figure 3:
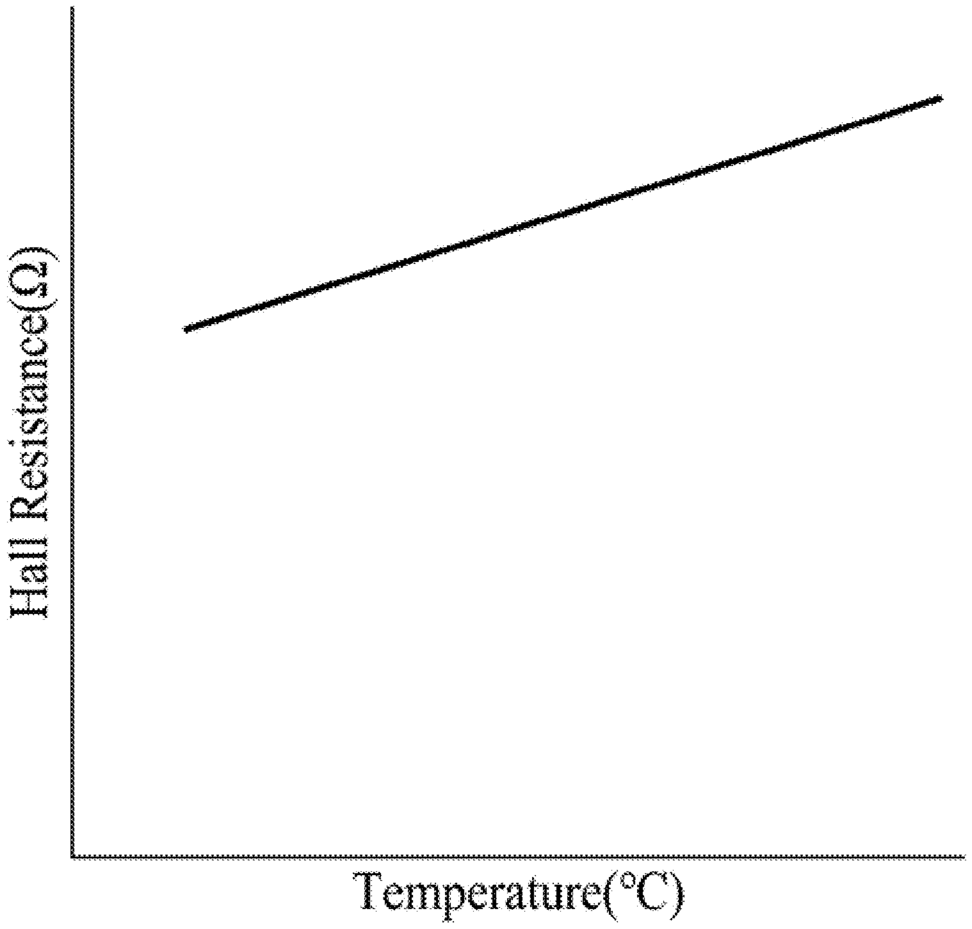
FIG. 3 is a graph showing an example of a hall resistance change based on a temperature change, according to an embodiment.

FIG. 2 is a circuit diagram showing a configuration of an analog front-end (AFE) circuit in an OIS control driver, according to an embodiment of the present disclosure. FIG. 3 is a graph showing an example of a hall resistance change based on a temperature change, according to an embodiment.

Referring to FIG. 2, the AFE circuit 200 according to an embodiment may include the PGA 210, the temperature sensor 220, the hall bias correction loop circuit 230, the offset correction loop circuit 240, and the ADC 250.

The hall sensor unit 130 shown in FIG. 2 may represent any one of the plurality of hall sensors 132, 134, 136, and 138, and hereinafter, may be represented as the hall sensor 130.

The temperature sensor 220 may include an on-ship temperature sensor and may sense a temperature change to output a temperature change sensing signal. The temperature sensor 220 may operate the hall bias correction loop circuit 230 and the offset correction loop circuit 240 according to the temperature change sensing signal. The temperature sensor 220 may control a hall bias Cal. tracking operation of the hall bias correction loop circuit 230 according to the temperature change sensing signal and control an offset Cal. tracking operation of the offset correction loop circuit 240.

The hall bias correction loop circuit 230 may include a hall bias current source 231, a hall bias current correction logic circuit 232 including a hall bias Cal. tracking logic, and a multiplexer (MUX) 233. The hall bias current correction logic circuit 232 may be represented by a hall bias Cal. tracking logic circuit 232.

The MUX 233 may select any one of a plurality of hall vias reference voltages VREF_HALL_BIAS_CAL[1] to [N−1] according to a hall vias reference voltage selection signal HALL_BIAS_REF_SEL and output the selected voltage to the hall bias current correction logic circuit 232.

The hall bias current correction logic circuit 232 may track the resistance change of the hall sensor 130 due to a temperature change according to the temperature change sensing signal while comparing a sensing voltage HINP or HINN of the hall sensor 130, which is varied according to a temperature change, with the reference voltage VREF_HALL_BIAS_CAL, generate N-bit current correction data DOUT_HALL_BIAS according to the comparison result, and output the generated data to the hall bias current source 231. The hall bias current correction logic circuit 232 may generate the N-bit current correction data DOUT_HALL_BIAS using output of the SAR logic.

The hall bias current correction logic circuit 232 may adjust an output current $I_{DAC}$ of a current digital-to-analog converter (IDAC) 231 as an N-bit programmable hall bias current source according to the current correction data DOUT_HALL_BIAS to correct an input range of the sensing voltage HINP or HINN input to the AFE circuit 200 from the hall sensor 130.

$$V_{HALL\_CM}=\mathrm{AVDD}-(I_{DAC}/2)R_{HALL} \qquad \text{<Equation 1>}$$

In Equation 1 above, $V_{HALL\_CM}$ may refer to a common voltage (intermediate voltage) of the hall sensor 130, AVDD may refer to a power voltage supplied to the hall sensor 130, $I_{DAC}$ may refer to an output current of the IDAC 231 as the N-bit programmable hall bias current source connected to the hall sensor 130, and $R_{HALL}$ may refer to a resistance value of the hall sensor 130.

As seen from FIG. 3, resistance of the hall sensor increases in proportion to a temperature increase.

The hall bias current correction logic circuit 232 may perform correction by tracking a sensing voltage change of the hall sensor 130 according to the resistance change $R_{HALL}$ of the hall sensor 130 due to the temperature change and adjusting the output current $I_{DAC}$ of the IDAC 231 as the hall bias current source.

The IDAC 231 as the N-bit programmable hall bias current source may be configured with any one of various current generators including a binary weighted current-steering DAC, and a segment current-steering DAC, which are capable of generate the output current $I_{DAC}$ according the current correction data DOUT_HALL_BIAS.

The hall bias current correction logic circuit 232 may perform an automatic correction operation according to an option operation. When an enable signal DOUT_HALL_BIAS_EXT_EN stored in a register is enabled according to the option operation, the hall bias current correction logic circuit 232 may perform a correction operation according to an external control signal DOUT_HALL_BIAS_EXT that is manually generated from the outside through a control pin rather than performing an automatic correction operation.

The hall bias current correction logic circuit 232 may include an option selecting MUX, a comparator configured to compare the sensing voltage HINP or HINN of the hall sensor 130 with the reference voltage VREF_HALL_BIAS_CAL, and a hall bias current tracking logic such as an SAR logic configured to generate current correction data DOUT_HALL_BIAS according to the comparison result of the comparator and output the generated data to the IDAC 231 as the hall bias current source.

The offset correction loop circuit 240 may include an offset compensation DAC 241, an offset compensation logic circuit 242 including an offset cal. tracking logic, and a MUX 243. The offset compensation logic circuit 242 may also be expressed by the offset cal. tracking logic circuit 242.

The offset correction loop circuit 240 may perform an offset correction operation after the sensing voltage correction operation of the hall bias correction loop circuit 230.

The MUX 243 may select any one of a plurality of offset reference voltages VREF_OFFSET_CAL[1] to [N−1] according to an offset reference voltage selection signal OFFSET_CAL_REF_SEL and output the selected voltage to the offset compensation logic circuit 242.

To compensate for an offset change based on a temperature change according to a temperature change sensing signal after the sensing voltage correction operation of the hall bias correction loop circuit 230, the offset compensation logic circuit 242 may track the offset change while comparing an output voltage VOUT of the PGA 210 with an offset reference voltage VREF_OFFSET_CAL, generate N-bit offset correction data DOUT_OFFSET according to the comparison result, and output the generated data to the offset compensation DAC 241.

The offset compensation DAC 241 may correct the output voltage VOUT of the PGA 210 based on an offset $V_{OS\_HALL}$ of the hall sensor 130 and an offset $V_{OS\_AMP}$ of the PGA 210 by generating an offset correction voltage $V_{DAC}$ according to the offset correction data DOUT_OFFSET and supplying the generated voltage to a first input (+) terminal of the PGA 210 through a variable resistor VR1.

$$V_{OUT}=R2/R1(\mathrm{HINP}-\mathrm{HINN})-V_{OS\_HALL}-V_{OS\_AMP}+V_{DAC} \quad \text{<Equation 2>}$$

In Equation 2 below, VOUT may refer to an output voltage of the PGA 210, R1 may refer to a resistance value connected to a second input (−) terminal of the PGA 210, R2 may refer to a resistance value connected to the first input (+) terminal of the PGA 210, HINP and HINN may refer to sensing voltages of the hall sensor 130, $V_{OS\_HALL}$ may refer to an offset voltage of the hall sensor 130, $V_{OS\_AMP}$ may refer to an offset voltage of the PGA 210, and $V_{DAC}$ may refer to an offset correction voltage output from the offset compensation DAC 241.

The offset compensation logic circuit 242 may correct the output voltage VOUT of the PGA 210 based onoffsets of the hall sensor 130 and the PGA 210 by correcting the offset $V_{OS\_HALL}$ of the hall sensor 130 and the offset $V_{OS\_AMP}$ of the PGA 210, which are changed based on a temperature change, to the offset correction voltage $V_{DAC}$.

The PGA 210 may differentially amplify the sensing voltages HINP and HINN from which the offset components $V_{OS\_HALL}$ and $V_{OS\_AMP}$ of the hall sensor 130 and the PGA 210 are removed based on the offset correction voltage $V_{DAC}$ to generate the output voltage VOUT, according to Equation 2 above.

The offset compensation DAC 241 may include any one of various DAC circuits including a resistor DAC (RDAC) configured to generate the offset correction voltage $V_{DAC}$ according to the offset correction data DOUT_OFFSET, an R-2R DAC, and a capacitor DAC (CDAC).

The offset compensation logic circuit 242 may perform an automatic correction operation according to an option operation. When an enable signal DOUT_OFFSET_EXT_EN stored in a register is enabled according to the option operation, the offset compensation logic circuit 242 may perform a correction operation according to an external control signal DOUT_OFFSET_EXT that is manually generated from the outside through a control pin rather than performing an automatic correction operation.

The offset compensation logic circuit 242 may include an option selecting MUX, a comparator configured to compare the output voltage VOUT with the offset reference voltage VREF_OFFSET_CAL, and an offset tracking logic such as an SAR logic configured to generate the offset correction data DOUT_OFFSET according to the comparison result of the comparator and output the generated data to the offset compensation DAC 241.

As such, the AFE circuit 200 according to an embodiment may correct the range of a sensing voltage of a hall sensor, which is varied based on a temperature change, using an operation of the hall bias correction loop circuit 230, and then the offset correction loop circuit 240 may perform an operation of correcting an offset of the hall sensor 130 and an offset of the PGA 210 based on a temperature change. The hall bias correction loop circuit 230 and the offset correction loop circuit 240 may independently perform an operation regardless of the limited number of times.

Figure 4:
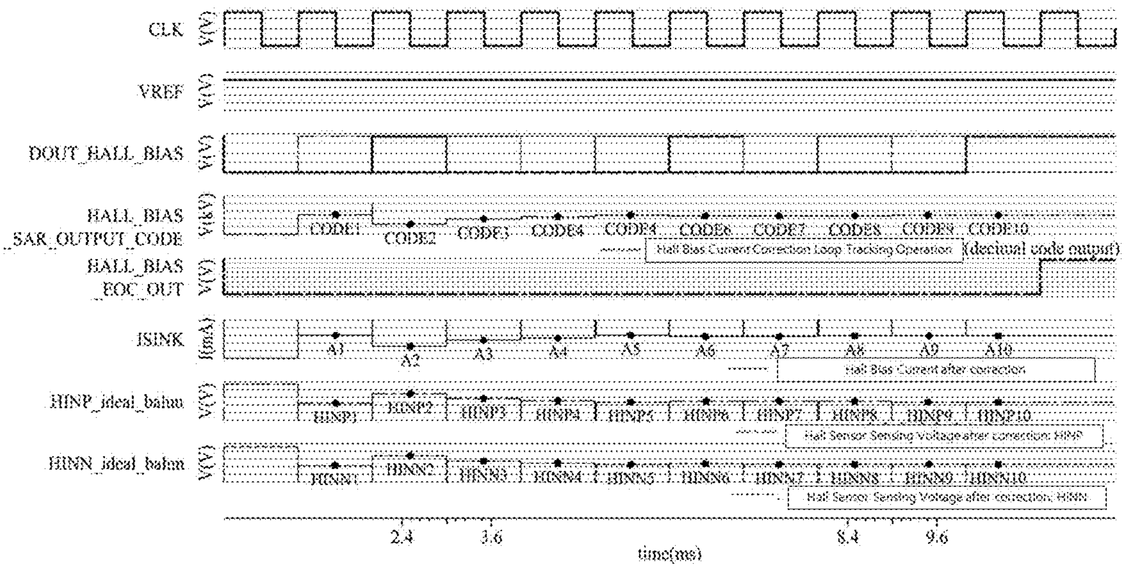
FIG. 4 is a timing diagram showing an example of an operation of a hall bias correction loop circuit according to an embodiment of the present disclosure.

FIG. 4 is a timing diagram showing an example of an operation of a hall bias correction loop circuit according to an embodiment of the present disclosure.

Referring to FIGS. 2 and 4, the hall bias correction loop circuit 230 according to an embodiment may operate according to a temperature change sensing signal supplied from the temperature sensor 220.

The hall bias correction loop circuit 230 may correct the sensing voltages HINP and HINN of the hall sensor 130 during a plurality of clock cycles by performing a hall bias current correction loop tracking operation for each cycle of a clock signal CLK using a master clock signal CLK.

The hall bias current correction logic circuit 232 may receive any one selected from the plurality of reference voltages VREF_HALL_BIAS_CAL[1] to [N−1] as a reference voltage VREF from the MUX 233.

The hall bias current correction logic circuit 232 may compare the sensing voltages HINP and HINN of the hall sensor 130 with the reference voltage VREF for each cycle of the clock signal CLK and output the N-bit current correction data DOUT_HALL_BIAS to the hall bias current source 231 based on output codes (HALL_BIAS_SAR_OUTPUT_CODE) CODE1 to CODE10 of the SAR logic generated according to the comparison result, to the hall bias current source 231.

The hall bias current correction logic circuit 232 may correct the sensing voltages HINP; HINP1 to HINP10 and HINN; HINN1 to HINN10 input to the AFE circuit 200 from the hall sensor 130 by adjusting output currents (ISINK) A1 to A10 of the hall bias current source IDAC 231 according to the current correction data DOUT_HALL_BIAS for each cycle of the clock signal CLK.

The hall bias current source (IDAC) 231 may output the output current A10 of the last clock cycle as the final output current ISINK in response to a hall basis output enable signal HALL_BIAS_EOC_OUT.

The hall bias correction loop circuit 230 may determine the sensing voltages HINP10 and HINN10 of the hall sensor 130, which are corrected in the last clock cycle according to the final output current (ISINK) A10 of the hall bias current source IDAC 231, as the final sensing voltages HINP and HINN, and output the determined voltages to the PGA 210.

Accordingly, the hall bias correction loop circuit 230 according to an embodiment may correct the sensing voltages HINP and HINN of the hall sensor 130 by tracking a resistance change of the hall sensor 130 due to a temperature change to adjust a hall bias current. Accordingly, the hall bias correction loop circuit 230 may prevent saturation of the output voltage VOUT and extend an input range of the sensing voltages HINP and HINN even if the PGA 210 amplifies the sensing voltages HINP and HINN with high gain.

Figure 5:
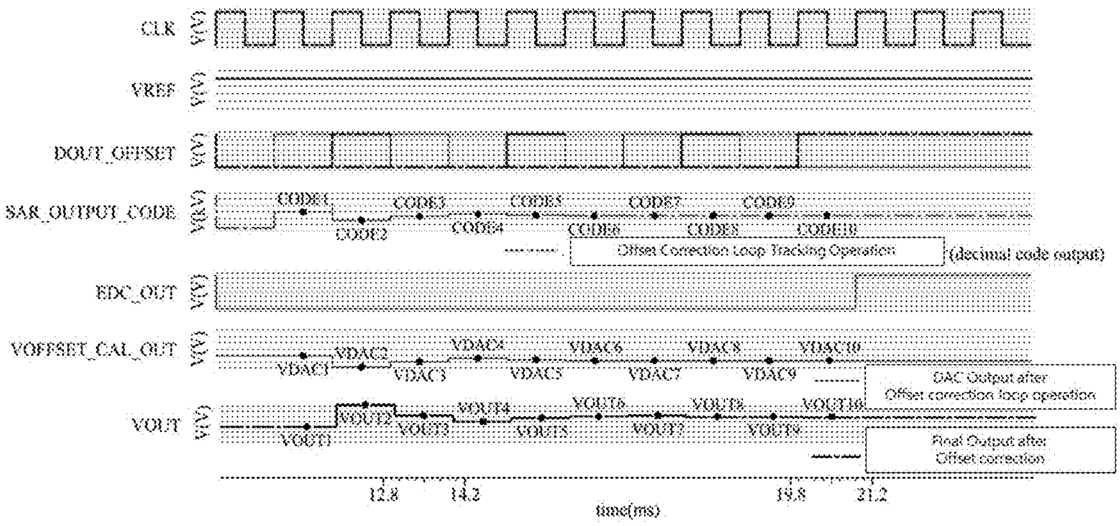
FIG. 5 is a timing diagram showing an example of an offset correction loop circuit according to an embodiment of the present disclosure.

FIG. 5 is a timing diagram showing an example of an offset correction loop circuit according to an embodiment of the present disclosure.

Referring to FIGS. 2 and 5, the offset correction loop circuit 240 according to an embodiment may operate according to a temperature change sensing signal supplied from the temperature sensor 220 and may operate after an operation of the hall bias correction loop circuit 230.

The offset correction loop circuit 240 may correct the output voltage VOUT of the PGA 210 based on an offset during a plurality of clock cycles by performing an offset correction loop tracking operation for each cycle of the clock signal CLK using the master clock signal CLK.

The offset compensation logic circuit 242 may receive any one selected from the plurality of reference voltages VREF_HALL_BIAS_CAL[1] to [N−1]) as the reference voltage VREF, from the MUX 243.

The offset compensation logic circuit 242 may compare the output voltage VOUT of the PGA 210 with the reference voltage VREF for each cycle of the clock signal CLK and output the N-bit offset correction data DOUT_OFFSET to the DAC 241 based on based on output codes (SAR_OUTPUT_CODE) CODE1 to CODE10 of the SAR logic generated according to the comparison result, to the DAC 241.

The offset compensation logic circuit 242 may correct the output voltage (VOUT) VOUT1 to VOUT10 of the PGA 210 based on an offset of the hall sensor 130 and an offset of the PGA 210 by adjusting the offset correction voltage (VOFFSET_CAL_OUT) VDAC1 to VDAC10 of the DAC 241 according to the offset correction data DOUT_OFFSET for each cycle of the clock signal CLK.

The offset compensation DAC 241 may output the offset correction voltage VDAC10 of the last clock cycle as the final offset correction voltage $V_{DAC}$ in response to the output enable signal EOC_OUT.

The PGA 210 may determine the output voltage VOUT10 corrected in the last clock cycle as the final output voltage VOUT and output the determined voltage to the ADC 250.

Accordingly, after the sensing voltage correction operation of the hall bias correction loop circuit 230, the offset correction loop circuit 240 according to an embodiment may correct the output voltage VOUT of the PGA 210 based on an offset of the hall sensor 130 and an offset of the PGA 210 by tracking a change in output voltage of the PGA 210 based on an offset change due to a temperature change and adjusting the offset correction voltage VDAC.

As described above, the AFE circuit according to an embodiment of the present disclosure may track and correct a sensing voltage change of a hall sensor due to a temperature change and an offset change of the hall sensor and amplifier circuit through an automatic correction loop.

The AFE circuit according to an embodiment of the present disclosure may prevent saturation of an output voltage and extend an input range of a sensing voltage even if an amplifier circuit amplifies the sensing voltage with high gain, by correcting a change in the sensing voltage of a hall sensor according to a resistance change of the hall sensor due to a temperature change.

The AFE circuit according to an embodiment of the present disclosure may remove offset components of the hall sensor and amplifier circuit in the output voltage of the amplifier circuit by correcting an offset correction voltage based on an offset change due to a temperature change to correct the output voltage of the amplifier circuit after the sensing voltage correction operation of the hall bias correction loop circuit.

Therefore, an OIS control driver including the AFE circuit according to an embodiment of the present disclosure may accurately detect and correct the position of an actuator position through the hall sensor regardless of a temperature change and an offset change, thereby correcting movement of the camera module due to hand shake and ensuring stability.

An analog front-end circuit according to an embodiment of the present disclosure may track and correct a sensing voltage change of a hall sensor due to a temperature change and an offset change of the hall sensor and amplifier circuit through an automatic correction loop.

The analog front-end circuit according to an embodiment of the present disclosure may prevent saturation of an output voltage and extend an input range of a sensing voltage even if an amplifier circuit amplifies the sensing voltage with high gain, by correcting a change in the sensing voltage of a hall sensor according to a resistance change of the hall sensor due to a temperature change.

The analog front-end circuit according to an embodiment of the present disclosure may remove offset components of the hall sensor and amplifier circuit in the output voltage of the amplifier circuit by correcting an offset correction voltage based on an offset change due to a temperature change to correct the output voltage of the amplifier circuit after the sensing voltage correction operation of the hall bias correction loop circuit.

Therefore, the OIS control driver including the analog front-end circuit according to an embodiment of the present disclosure may accurately detect and correct the position of an actuator position through the hall sensor regardless of a temperature change and an offset change, thereby correcting movement of the camera module due to hand shake and ensuring stability.

It will be appreciated by those skilled in the art to which the present disclosure belongs that the disclosure described above may be practiced in other specific forms without altering its technical ideas or essential features.

It should therefore be understood that the embodiments described above are exemplary and non-limiting in all respects. The scope of the present disclosure is defined by the appended claims, rather than by the detailed description above, and should be construed to cover all modifications or variations derived from the meaning and scope of the appended claims and the equivalents thereof.

What is claimed is:

1. An analog front-end circuit comprising:

a hall bias correction loop circuit configured to correct a sensing voltage of a hall sensor by adjusting a hall bias current flowing in the hall sensor while tracking a change in the sensing voltage of the hall sensor based on a temperature change;

an offset correction loop circuit configured to correct an output voltage of an amplifier circuit based on an offset voltage of the hall sensor and an offset voltage of the amplifier circuit by tracking an offset voltage change while comparing an output voltage change of the amplifier circuit with an offset reference voltage and by adjusting the offset voltage change;

the amplifier circuit configured to amplify and output the sensing voltage of the hall sensor, corrected through at least one of the hall bias correction loop circuit and the offset correction loop circuit; and an analog-digital converter configured to convert the output voltage of the amplifier circuit into sensing data and output the sensing data.

2. The analog front-end circuit of claim 1, further comprising:

a temperature sensor configured to sense the temperature change and control operations of the hall bias correction loop circuit and the offset correction loop circuit according to a sensing result.

3. The analog front-end circuit of claim 1, wherein the hall bias correction loop circuit performs a correction operation of the sensing voltage of the hall sensor and then the offset correction loop circuit performs an operation of correcting the output voltage.

4. The analog front-end circuit of claim 1, wherein the hall bias correction loop circuit and the offset correction loop circuit use a tracking method of a successive approximation register (SAR) logic.

5. The analog front-end circuit of claim 1, wherein the hall bias correction loop circuit and the offset correction loop circuit automatically operate according to an option signal or manually operate according to an external control signal.

6. The analog front-end circuit of claim 5, wherein the offset correction loop circuit includes:

a multiplexer configured to select and output any one of a plurality of offset reference voltages as a selected offset reference voltage;

an offset correction logic circuit configured to output offset correction data by tracking an offset change of the hall sensor and an offset change of the amplifier circuit based on the temperature change as an output of an SAR logic while comparing the output voltage of the amplifier circuit with the selected offset reference voltage; and an offset correction digital-analog converter configured to correct the output voltage of the amplifier circuit by generating an offset correction voltage and applying the offset correction voltage to an input terminal of the amplifier circuit according to the offset correction data.

7. The analog front-end circuit of claim 6, wherein the offset correction loop circuit repeatedly performs an operation of correcting the output voltage of the amplifier circuit by correcting the offset correction voltage based on the temperature change during a plurality of cycles of a clock signal and outputs the output voltage of the amplifier circuit, corrected by a lastly adjusted offset correction voltage, to the analog-digital converter.

8. The analog front-end circuit of claim 1, wherein the hall bias correction loop circuit includes:

a multiplexer configured to select and output any one of a plurality of hall bias reference voltages as a selected hall bias reference voltage;

a hall bias current correction logic circuit configured to output current correction data by tracking a resistance change of the hall sensor based on the temperature change as an output of an SAR logic while comparing the sensing voltage of the hall sensor, changed based on the temperature change, with the selected hall bias reference voltage; and a hall bias current source configured to adjust the hall bias current according to the current correction data.

9. The analog front-end circuit of claim 8, wherein the hall bias current source includes a current digital-analog converter configured to convert the current correction data into the hall bias current.

10. The analog front-end circuit of claim 8, wherein the hall bias correction loop circuit repeatedly performs an operation of correcting the sensing voltage of the hall sensor by adjusting the hall bias current based on the temperature change during a plurality of cycles of a clock signal and outputs the sensing voltage of the hall sensor, corrected by a last adjusted hall bias current, to the amplifier circuit.

* * * * *